United States Patent [19]

Popp et al.

[11] Patent Number: 5,200,703
[45] Date of Patent: Apr. 6, 1993

[54] ANTI-INTERFERENCE FILTER FOR A GRADIENT COIL IN A NUCLEAR MAGNETIC RESONANCE IMAGING APPARATUS

[75] Inventors: Walter Popp, Emskirchen; Karl-Ulrich Erlenkamp; Peter Feld, both of Nuremberg; Norbert Rietsch, Dormitz; Markus Vester, Erlangen, all of Fed. Rep. of Germany

[73] Assignee: Siemens Atkiengesellschaft, Munich, Fed. Rep. of Germany

[21] Appl. No.: 764,349

[22] Filed: Sep. 23, 1991

[30] Foreign Application Priority Data

Oct. 15, 1990 [DE] Fed. Rep. of Germany ....... 4032707

[51] Int. Cl.⁵ .............................................. G01V 3/00
[52] U.S. Cl. ...................................... 324/322; 324/318
[58] Field of Search .............. 324/300, 307, 309, 318, 324/322; 128/653 SC

[56] References Cited

U.S. PATENT DOCUMENTS

| | | | |
|---|---|---|---|
| 4,628,264 | 12/1986 | Rzedzian | 324/322 |
| 4,644,282 | 2/1987 | Kestler | 324/322 |
| 4,737,712 | 4/1988 | Stormont et al. | 324/307 |
| 4,820,986 | 4/1989 | Mansfield et al. | 324/322 |
| 4,862,084 | 8/1989 | Mitomi | 324/322 |
| 4,910,461 | 3/1990 | Van Vaals | 324/318 |
| 5,063,349 | 11/1991 | Roemer et al. | 324/322 |

FOREIGN PATENT DOCUMENTS

| | | |
|---|---|---|
| 0306763 | 3/1989 | European Pat. Off. . |
| 3545405 | 7/1987 | Fed. Rep. of Germany . |
| 4024164 | 2/1991 | Fed. Rep. of Germany . |

OTHER PUBLICATIONS

"Taschenbuch der Hochfrequenztechnik", Meinke et al. pp. 198-199 (1962).
Patent Abstracts of Japan, E-712 Feb. 6, 1989, vol. 13/No. 51, Japanese Application No. 62-79316.

*Primary Examiner*—Louis Arana
*Attorney, Agent, or Firm*—Steadman & Simpson Hill

[57] ABSTRACT

An anti-interference filter for radio-shielding a feeder to a gradient coil in a nuclear magnetic resonance imaging apparatus is constructed as a band elimination (band rejection) filter for the operating frequency of the nuclear magnetic resonance imaging apparatus. The anti-interference filter can be in the form of a directionally symmetrical quadrupole having two input terminals and two output terminals. A first input terminal and a first output terminal are introducible into the feeder to the gradient coil, and a second input terminal and a second output terminal are connected to a conductor at reference potential. A number of blocking circuits are arranged in series between the first input terminal and the first output terminal. A number acceptor circuits are arranged between the input terminals, between the junctions of the blocking circuits and the reference potential conductor, and between the output terminals. The number of acceptor circuits is one more than the number of blocking circuits.

12 Claims, 5 Drawing Sheets

ANTI-INTERFERENCE FILTER FOR A GRADIENT COIL IN A NUCLEAR MAGNETIC RESONANCE IMAGING APPARATUS

BACKGROUND OF THE INVENTION

1. Field of the Invention

The present invention is directed to an anti-interference filter for radio-shielding a feeder to a gradient coil in a nuclear magnetic resonance imaging apparatus.

2. Description of the Prior Art

In a typical magnetic resonance imaging apparatus for producing tomograms, radio-frequency nuclear magnetic resonance signals are caused to be emitted from a patient, and are received by an antenna and are evaluated for generating a tomogram of the subject. The nuclear magnetic resonance signals are of extremely low power, so that particular attention must be paid to conducting an undisturbed processing of those signals. In particular, introducing interference to the reception antenna must be avoided. The antennas or resonators for exciting and picking-up the nuclear resonance signals, and the coils for generating the required magnetic fields, are therefore in conventional systems arranged in a radio-frequency-tight compartment, into which unwanted signals cannot penetrate. This also assures that the radio-frequency fields generated by the antennas cannot proceed to the exterior of the enclosure as an unwanted signal.

The coils for generating the gradient magnetic fields, referred to herein as gradient coils, are supplied via a gradient power supply disposed outside the radio-frequency enclosure, so that it is possible for interference signals to proceed into the interior of the radio-frequency enclosure via the feeders to the gradient coils. In order to suppress this interference, it is known to use anti-interference filters connected between the feeders and the gradient coils.

Certain boundary conditions must be observed in the design of such anti-interference filters for the feeders to the gradient coils. A high direct current, given low d.c. attenuation and high radio-frequency blocking attenuation, must be conducted into the radio-frequency enclosure via the anti-interference filter. Due to saturation as a result of the high static magnetic field in the magnetic resonance imaging apparatus, and the high currents required for excitation of the gradient coils, inductances in the anti-interference filter cannot be constructed with ferrite materials. The gradient fields are activated and deactivated in a defined sequence during a transmission/reception cycle, and the anti-interference filter for the gradient power supply can therefore only represent a maximum capacitative load. The values of the capacitance in the anti-interference filter are dependent on the nominal operating data for the gradient power supply, and should not exceed a maximum value.

Known anti-interference filters are constructed as low-pass filters, which prevent all frequencies higher than a defined, lower limit frequency from entering the radio-frequency enclosure. The lower limit frequency is substantially set by the leading or trailing edge of the gradient pulse in the activation or deactivation of the gradient coils. Low-pass filters are particularly employed in magnetic resonance imaging systems in order to evaluate the nuclear magnetic resonance of the nuclei of different substances. Such filters are insensitive to tolerances, and therefore need not be manufactured or tuned with great precision. The coils employed in the low-pass filters, however, occupy a large amount of space, because high inductance values must be used, given a low d.c. resistance. Moreover, in order to achieve a blocking attenuation, low-pass filters of a higher order must be used. The coils of such higher order filters must be individually shielded, because their inductances would otherwise be reduced due to mutual couplings. For this reason, only low-pass filters of at most the fifth order have heretofore been used.

SUMMARY OF THE INVENTION

It is an object of the present invention to provide an anti-interference filter for radio-shielding a feeder to a gradient coil in a nuclear magnetic resonance imaging apparatus which has a reduced space requirement and a reduced requirement for material outlay.

It is also an object of the present invention to provide such an anti-interference filter which is capable of carrying a high direct current with extremely low d.c. attenuation, and high radio-frequency blocking attenuation.

It is a further object of the present invention to provide such an anti-interference filter which represents a low capacitative load to the gradient amplifier connected in the circuit for the gradient coil.

The above objects are achieved in accordance with the principles of the present invention in an anti-interference filter which is constructed as a band elimination (band rejection) filter for the operating frequency of the nuclear magnetic resonance imaging apparatus. It is thus possible to construct anti-interference filters of a higher order than have heretofore been practical. The inductances required for this purpose are small, and the space required is also capable of being maintained small. Decoupling of the inductances can easily be implemented.

In an embodiment of the invention, the anti-interference filter is in the form of a direction-symmetrical quadrupole having two input terminals and two output terminals. A first input terminal and a first output terminal are introducible into the feeder of the gradient coil, and a second input terminal and a second output terminal are connected to a conductor at reference potential. A plurality of blocking circuits are arranged in series between the first input terminal and the first output terminal. A plurality of acceptor circuits are arranged between the input terminals, between the junctions of the blocking circuits and the reference potential conductor, and between the output terminals. The number of acceptor circuits is larger by one than the number of blocking circuits. In a filter having this structure, the desired blocking attenuation and the required bandwidth can be achieved by an iterative connection of a corresponding number of acceptor circuits and blocking circuits.

A simple structure of the anti-interference filter is possible in an embodiment wherein the blocking circuits consist of a parallel circuit formed by a blocking circuit coil and a blocking circuit capacitor, and the acceptor circuits consist of a series circuit formed by an acceptor circuit coil and an acceptor circuit capacitor.

In a further embodiment of the invention, the blocking circuit coils have a center tap, these center taps being connected via capacitors to the reference potential conductor. Radio-shielding can thus also be achieved for frequencies above the limit frequency of the band elimination filter.

In an advantageous embodiment, the blocking coils are arranged in one plane, and are composed of conductor sections which have a generally serpentine path in this plane. Good decoupling of the blocking coils from each other is thus achieved, and the structural height of the anti-interference filter can be maintained low.

In another advantageous embodiment, the blocking circuit coils are contacted at a first side of a printed circuit board, and the elements which form the circuit coils of those acceptor circuits which are connected to the junctions of the blocking circuits are arranged at the same side of the printed circuit board. The blocking circuit capacitors, and the acceptor circuit capacitors for those acceptor circuits connected to the junctions, are arranged at a first side of the printed circuit board. The second side of the printed circuit board is substantially completely covered by a thin metallization, which is connected to the reference potential conductor. This embodiment is particularly easy to assembly, because the blocking circuit capacitors and the acceptor circuit capacitors can be soldered onto the printed circuit board before the blocking circuit coils, which have a relatively large conductor cross section, are attached to the printed circuit board.

In a further advantageous embodiment, the blocking and acceptor circuits of the quadrupole are arranged in a shielded housing closed on all sides. The first input terminal and the first output terminal of the quadrupole are conducted out of the shielded housing via respective insulated bushings. The reference potential conductor is connected to the shielded housing. The shielded housing thus represents a waveguide, and the ratio of the length-to-width of the shielded housing is selected so that its waveguide attenuation is larger than the filter attenuation. It is thus assured that the anti-interference effect of the anti-interference filter is not reduced by a waveguide wave which may bridge the anti-interference filter.

In a further embodiment, the acceptor circuits in the shielded housing connected to the terminals are directly connected to the aforementioned bushings and to the shielded housing. These acceptor circuits form conductor loops which are disposed perpendicularly relative to each other. The anti-interference effect of the filter thus begins directly at the bushings in the shielded housing, because the acceptor circuits arranged at the bushings in the housing eliminate reference potential interference at the bushings. By disposing the conductor loops vertically relative to each other, magnetic coupling between the acceptor circuits at the bushings is substantially avoided.

In another embodiment, two anti-interference filters are arranged at a small distance from each other in a shielded housing such that the respective blocking circuit coils in the two filters are substantially congruent. The respective directions of the direct current in the two anti-interference filters are opposite, so that the respective magnetic fields produced by these direct currents substantially cancel each other in the shielded housing. As a result of this arrangement of the two anti-interference filters for the forward conductor and for the return conductor of a gradient coil, the magnetic field generated by the gradient current is substantially cancelled. The uniform static magnetic field in the radio-frequency enclosure is thus substantially undisturbed by the anti-interference filter.

DESCRIPTION OF THE PREFERRED EMBODIMENTS

Figure 1:
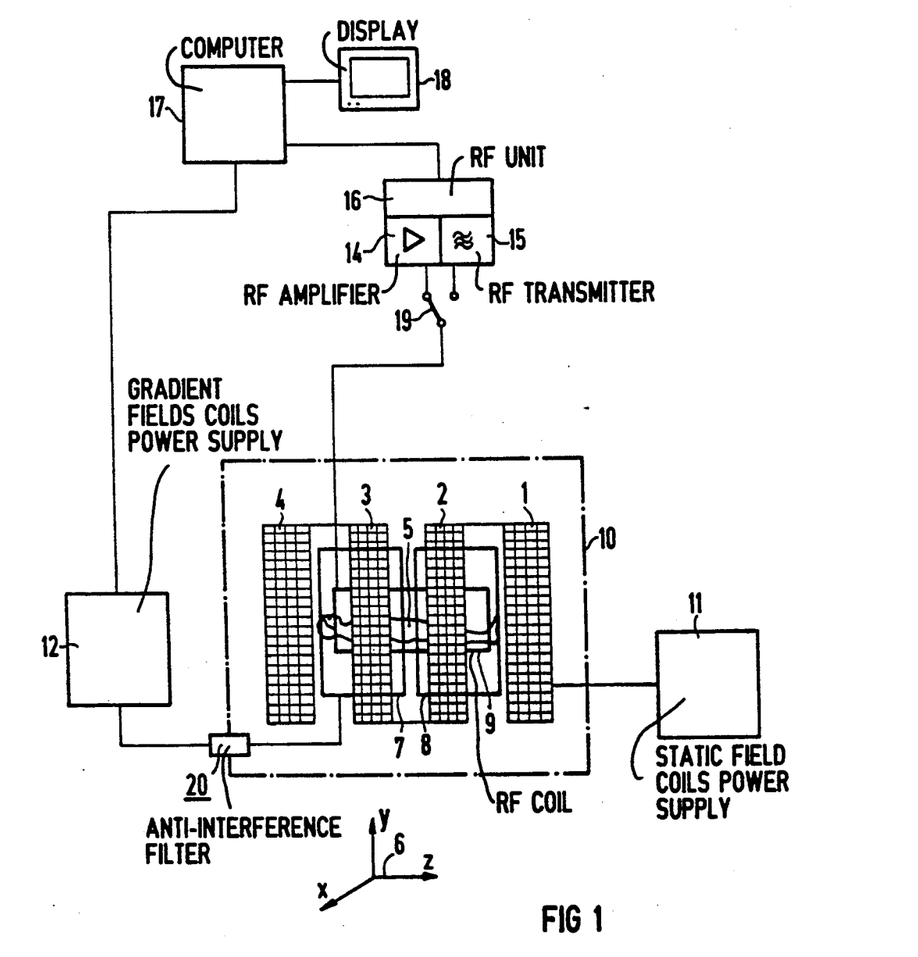
FIG. 1 is a schematic block diagram of the basic components of a magnetic resonance imaging apparatus, of the type in which the anti-interference filter disclosed herein can be used.

The basic components of a typical nuclear magnetic resonance imaging apparatus (magnetic resonance imaging tomography apparatus), in which the filter disclosed herein can be used, are shown in FIG. 1. The apparatus includes coils 1, 2, 3 and 4, which generate a substantially uniform static magnetic field having high field strength. For medical diagnostics, the body 5 of a patient to be examined is situated in this static field. Gradient coils are also allocated thereto, which are provided for generating independent magnetic field components perpendicular to each other in the x,y and z-directions indicated by the coordinate axes 6. For clarity, only the gradient coils 7 and 8 are shown in FIG. 1 which, in combination with a pair of identical gradient coils disposed on the other side of the body 5, generate a gradient in x-direction. Pairs of gradient coils (not shown) for generating a gradient field in the y-direction are provided parallel to, above and below, the body 5. Pairs of gradient coils (not shown) for generating a gradient field in z-direction are disposed transversely to the longitudinal axis of the body 5 at the head and feet thereof.

The apparatus also includes a radio-frequency coil 9, for generating and picking-up the nuclear magnetic resonance signals. The coils 1 through 4 and 7 through 9, bounded by a dot-dash line 10, represent the actual examination apparatus. A volume which must be substantially free of unwanted signals is also defined in this examination apparatus, which will be referred to below as the radio-frequency compartment or enclosure.

The coils 1 through 4 and 7 through 9 disposed in the radio-frequency enclosure are driven by an electrical arrangement which includes a power supply 11 for the static field coils 1 through 4, and a gradient fields power supply 12 to which the coils 7 and 8, and the further gradient coils (not shown) are connected. The current supplied by the gradient fields power supply 12 for energizing the gradient coils is on the order of magnitude of 200 A. The capacitative load on the gradient fields power supply 12 cannot exceed, for example, 20 nF.

The radio-frequency coil 9 is connected to a radio frequency unit 16. In a transmission mode, a switch 19 connected to a radio-frequency coil 9 to a radio-frequency transmitter 15 in the radio-frequency unit 16. In a reception mode, the switch 19 connects the radio-frequency coil 9 to an amplifier 14 in the radio-frequency unit 16. The components of radio-frequency unit 16 are connected to a computer 17 which controls the sequence of operation of the gradient coils, and which also constructs a visible image from the magnetic resonance signals, which is portrayed on a display 18 connected thereto.

The feeders from the gradient fields power supply 12 to the gradient coils 7 and 8 for the gradient field in x-direction, and for the other gradient coils (not shown) for generating the gradient fields in y-direction and the z-direction, must be radio-shielded when they are connected to the radio-frequency enclosure represented by the dot-dash line 10. To that end, the feeders are conducted into the radio-frequency enclosure 10 via anti-interference filters 20. Only one anti-interference filter 20 is shown, however, it will be understood that an anti-interference filter 20 must be inserted into every feeder. Without these anti-interference filters 20, undesired signals would be coupled into the radio-frequency enclosure 10 via the feeders, and these undesired signals could be erroneously picked-up by the radio-frequency coil 9 as nuclear magnetic resonance signals. High-power radio-frequency pulses having a peak power of several kilowatts are generated for exciting the nuclear magnetic resonance signals in the radio-frequency enclosure 10. The anti-interference filters 20 therefore should also prevent these signals from appearing outside of the radio-frequency enclosure 10 as interference signals.

Figure 2:
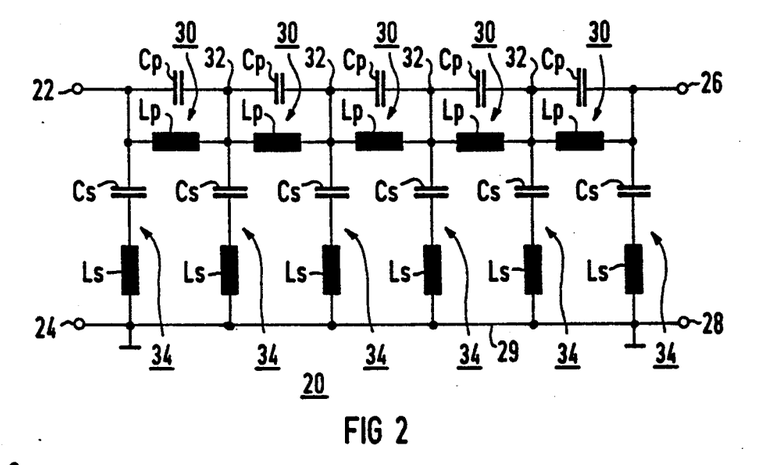
FIG. 2 is an electrical circuit diagram of a first embodiment of an anti-interference filter constructed in accordance with the principles of the present invention.

In accordance with the principles of the present invention, the anti-interference filters 20 are constructed as band elimination (band rejection) filters having a center frequency corresponding to the operating frequency of the nuclear magnetic resonance imaging apparatus. This ensures a sufficient interference suppression because the radio-frequency coil 9 is only selectively sensitive for the operating frequency of the nuclear magnetic resonance imaging apparatus. A circuit diagram of an anti-interference filter 20 of the eleventh order, constructed as a band elimination filter, is shown in FIG. 2. The anti-interference filter 20 is constructed as a directionally symmetrical quadrupole having two input terminals 22 and 24 and two output terminals 26 and 28. The terminals 24 and 28 are connected to each other via a conductor 29 at reference potential. Five blocking circuits 30, each consisting of a parallel circuit of a blocking circuit capacitor Cp and a blocking circuit coil Lp, are connected in series between the first input terminal 22 and the first output terminal 26. The blocking circuits 30 are each tuned to resonate at the operating frequency of the nuclear magnetic resonance imaging apparatus. The impedance of the blocking circuits 30 is thus extremely high for that operating frequency. Respective acceptor circuits 34 are connected between the input terminals 22 and 24, between the junctions 32 of the blocking circuits 30 and the reference potential conductor 29, and between the output terminals 26 and 28. Six acceptor circuits 34 and five blocking circuits 30 are thus present in the anti-interference filter 20. Given this structure of the anti-interference filter 20, the number of acceptor circuits 34 will always be one higher than the number of blocking circuits 30, even if different orders of this filter are constructed.

The acceptor circuits 34 each consist of a series circuit formed by an acceptor circuit coil Ls and an acceptor circuit capacitor Cs. Just as the blocking circuits 30, the acceptor circuits 34 are each tuned to the operating frequency of the nuclear magnetic resonance imaging apparatus. The impedances of the acceptor circuits 34 are extremely low at this operating frequency. The noise signals and signal harmonics having this operating frequency which may still be permitted to pass by the blocking circuits 30 the blocking circuits 30 are not ideal filters) are directly dissipated into the reference potential conductor 29 via the acceptor circuits 34.

Figure 3:
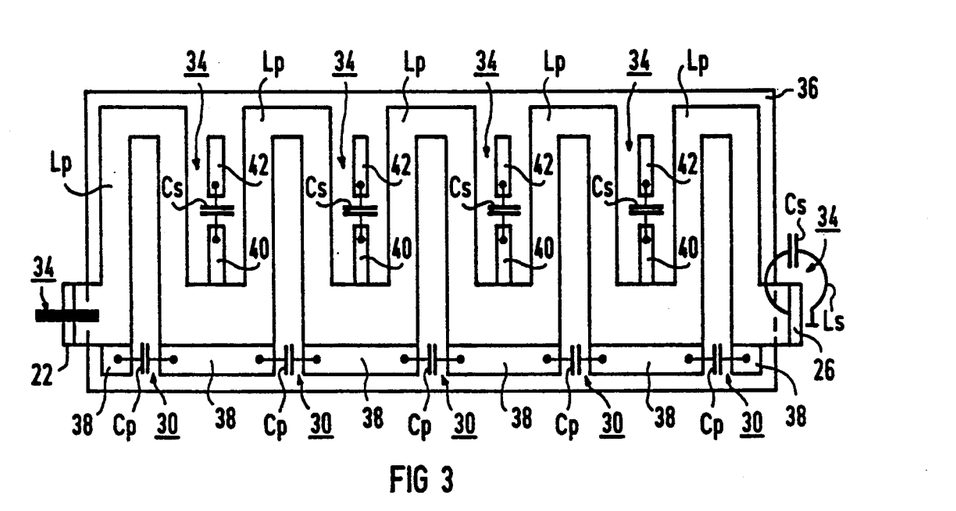
FIG. 3 is a plan view of a mechanical realization of the anti-interference filter of FIG. 2.

A plan view of the mechanical structure of the anti-interference filter 20, corresponding to the circuit diagram of FIG. 2, is shown in FIG. 3. The blocking circuit coils Lp are arranged in one plane between the first input terminal 22 and the first output terminal 26. Each blocking coil Lp is composed of conductor sections following a serpentine path. Given dimensioning of a blocking circuit 30 approximating the dimensions of FIG. 3, a U-shaped conductor section is sufficient for achieving an inductance of, for example, 15 nH for the blocking circuit coil Lp. Because the high direct current of, for example, 200 A for the gradient coil flows through the blocking circuit coils Lp, the cross section of the blocking circuit coils Lp is selected of a size such that the d.c. resistance between the terminals 22 and 26 is sufficiently low, for example 0.6 through 0.8 milliohms. The cross section of the blocking circuit coils Lp is rectangular, that a planar base surface can be contacted to a printed circuit board 36 via an insulated screwed connection. To that end, an interconnect having a shape coinciding with the shape of the base area of the blocking circuit coils Lp is fashioned on the printed circuit board 36 at that side to which the blocking circuit coils Lp are to be contacted. This interconnect has projecting terminals 38, which respectively emerge at the ends of the U-shaped blocking circuit coils Lp. The terminals 38 serve for soldering the blocking circuit capacitors Cp, and thus create the connection of a blocking circuit coil Lp to a blocking circuit capacitor Cp to form the blocking circuit 30.

A further interconnect 40 is directed parallel to the legs of the U-shaped blocking circuit coils Lp, and is connected to each junction 32. The length of the interconnect 40 is dimensioned so that it forms half of the inductance for the acceptor circuit coils Ls. Interconnects 42, of the same length as the interconnect 40, are arranged spaced from the interconnects 40. The interconnects 42 form the other half of the inductance of the acceptor circuit coil Ls. Connection between the interconnects 40 and 42 is made via the acceptor circuit capacitors Cs. That end of the interconnect 42 facing away from the acceptor circuit capacitor Cs is connected to a metallization 44, which covers the rear side of the printed circuit board 36. The metallization 44 is connected to the reference potential conductor 29.

The interconnects 40 and 42 in combination with the acceptor circuit capacitors Cs thus form the acceptor circuits 34 which are disposed between the junction 32 and the reference potential conductor 29.

The respective acceptor circuits 34 which are connected between the terminals 22 and 24 and between the terminals 26 and 28 are not connected on the printed circuit board 36, but are instead respectively directly electrically connected to the terminals 22 and 26 and, in the immediate proximity of the terminals 22 and 26, to an anti-interference housing (shown in later figures). The anti-interference filter housing is in turn connected to the reference potential conductor 29 via the metallization 44. Such a an acceptor circuit 34 is formed by an acceptor circuit capacitor Cs in combination with its leads or terminals. The length of the leads of the acceptor circuit capacitor Cs is selected so that they form the acceptor circuit coil Ls. To avoid magnetic coupling between the acceptor circuit 34 at the terminals 22 and 24 and the acceptor circuit 34 at the terminals 26 and 28, the surfaces formed by the conductor loops of the capacitor terminals are arranged perpendicularly relative to each other. This is shown in FIG. 3 wherein the conductor loop of the acceptor circuit 34 at the terminal 32 is disposed perpendicular to the plane of the drawing, and the conductor loop of the acceptor circuit 34 at the terminal 26 is parallel to the plane of the drawing.

Figure 4:
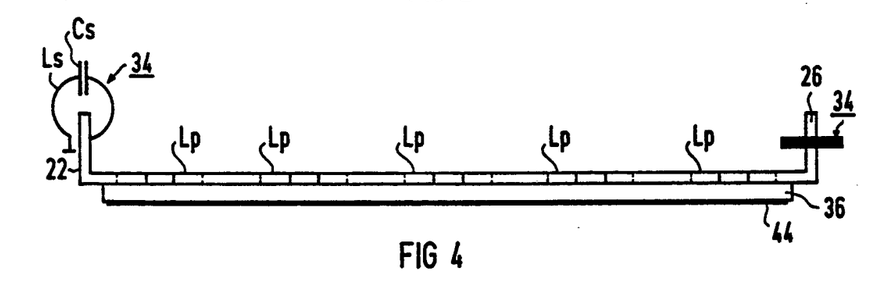
FIG. 4 is a side view of the anti-interference filter of FIG. 3.

A side view of the anti-interference filter 20, shown in plan view in FIG. 3, is shown in FIG. 4. The large cross section or thickness of the conductor sections for constructing the blocking circuit coils Lp can be seen in FIG. 4. The terminals 22 and 26 are bent at a right angle, with the structure of the acceptor circuits 34 at the terminals 22 and 24 and at the terminals 26 and 28 also being shown. A printed circuit board 36 is provided with the metallization 44 on that side thereof opposite the blocking circuit coils Lp.

Figure 5:
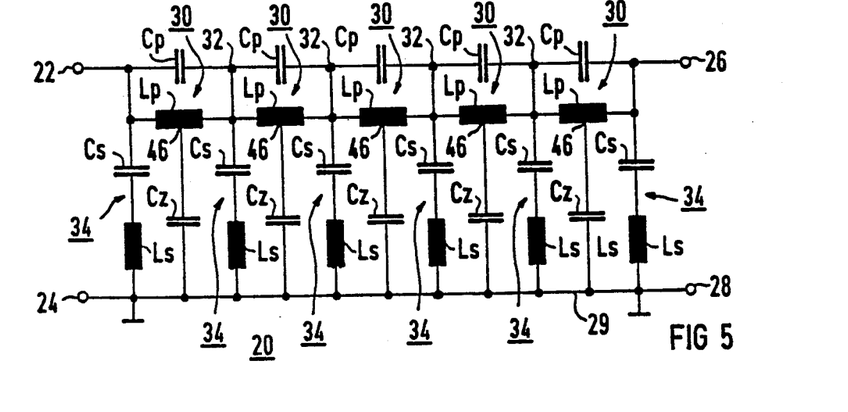
FIG. 5 is an electrical circuit diagram of a second embodiment of an anti-interference filter constructed in accordance with the priciples of the present invention, which also attenuates frequencies above the limit frequency of the band elimination filter.

A second embodiment of the anti-interference filter 20 is shown in FIG. 5, and has improved blocking attenuation in the frequency range above the upper limit frequency of the eliminated or rejected frequency band. Each blocking circuit coil Lp in the anti-interference filter 20 of FIG. 5 has a center tap 46. Each center tap 46 is connected via a capacitor Cz to the reference potential conductor 29. Otherwise, the structure of the anti-interference filter 20 of FIG. 5 corresponds to that shown in FIG. 2.

Figure 6:
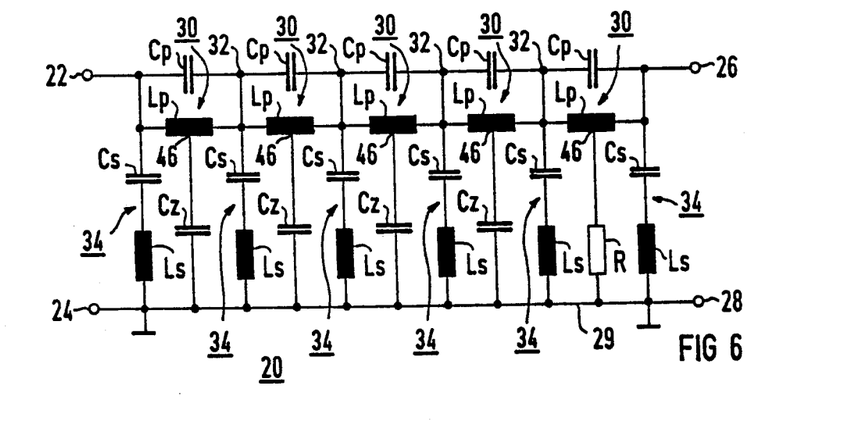
FIG. 6 is an electrical circuit diagram of a modified version of the anti-interference filter of FIG. 5, wherein the electrical potential between the input terminals and the output terminals is fixed.

The circuit of FIG. 6 represents a further modification of the anti-interference filter 20. As in the embodiment of FIG. 5, each blocking circuit coil Lp and the circuit of FIG. 6 has a center tap 46. In all of the blocking circuits 30 except the blocking circuit 30 closest to the output terminals 26 and 28, the center tap 46 is connected to a capacitor Cz which is also connected to the reference potential conductor 29, as in the embodiment of FIG. 5. In the blocking circuit 30 closest to the output terminals 26 and 28 in FIG. 6, however a resistor R is connected between the tap center 46 of the coil Lp and the reference potential conductor 29, instead of a capacitor Cz. Due to the presence of the resistor R, the d.c. voltage across the terminals 22 and 26 is defined with respect to the reference potential conductor 29. If anti-interference filters 20 constructed as shown in FIG. 6 are respectively inserted in both the forward feed line and in the return line for a gradient coil (for example gradient coils 7 and 8), the potential of the reference potential conductor 29 will be midway between the potential at the terminals of the gradient coil if the resistors R are of the same magnitude.

Figure 7:
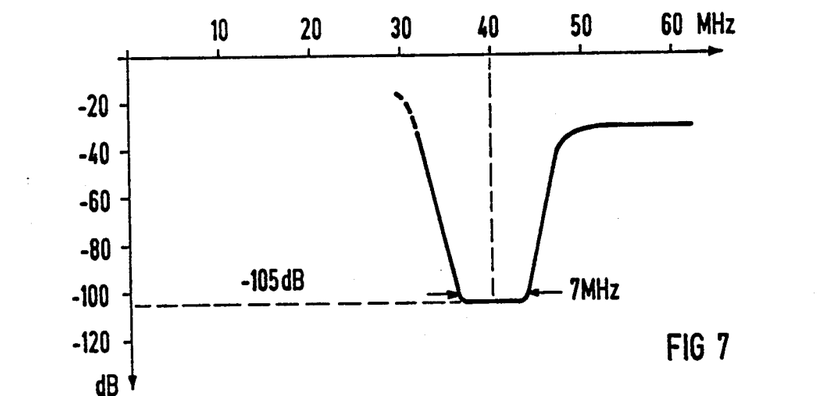
FIG. 7 is a graph showing the characteristic curve of the blocking attenuation of the anti-interference filters of FIGS. 2, 5 and 6.

The blocking attenuation of the anti-interference filters 20 is shown in FIG. 7. The frequency behavior of the anti-interference filters 20 according to FIG. 2, FIG. 5 and FIG. 6 is the same in the band elimination range around 40 MHz. A blocking attenuation of $-105$ dB, given a bandwidth of 7 MHz, is achieved with all versions of the anti-interference filter 20. Above 50 MHz, however, the frequency behavior of the different versions of the anti-interference filters 20 differs. Whereas the anti-interference filter 20 of FIG. 2 has no significant attenuation above 50 MHz, an attenuation of approximately $-30$ dB is still present in the anti-interference filters 20 of FIGS. 5 and 6, as a result of the capacitors Cz. This additional attenuation is desirable for attenuating interference in the harmonics range of the operating frequency.

The bandwidth of the anti-inteference filters 20 can be enlarged, for example to achieve a radio-shielding effect for several operating frequencies, by increasing the inductance of the blocking circuit coil Lp and/or reducing the capacitance of the blocking circuit capacitor Cp and/or increasing the capacitance of the acceptor circuit capacitor Cs and/or reducing the inductance of the acceptor circuit coil Ls.

Figure 8:
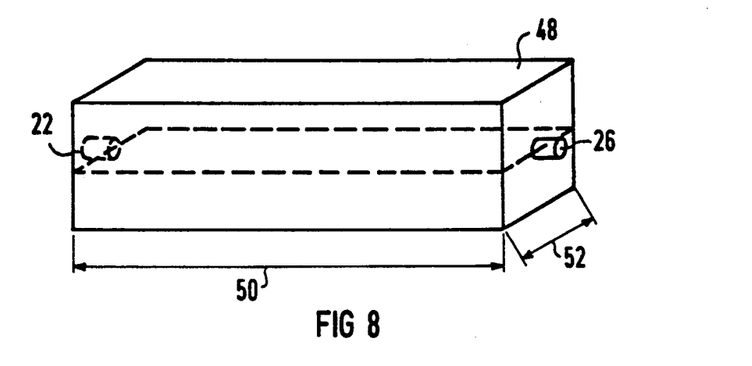
FIG. 8 is a perspective view of a shielded housing for use in combination with the anti-interference filter constructed in accordance with the principles of the present invention.

To avoid coupling-in of electromagnetic energy, the anti-interference filter 20 is contained in a shielded housing 48, as schematically shown in perspective view in FIG. 8. The terminals 22 and 26 are conducted out of the shielded housing 48 via bushings. The terminals 24 and 28 of the anti-interference filter are connected to the shielded housing 48. The shielded housing 48, however, represents a waveguide, through which energy in the form of waveguide waves can be transmitted between the respective end faces in which the terminals 22 and 26 are situated. The length 50 and the width 52 of the shielded housing 48 must therefore be selected so that the waveguide attenuation for the operating frequency is higher than the filter attenuation of the anti-interference filter.

Figure 9:
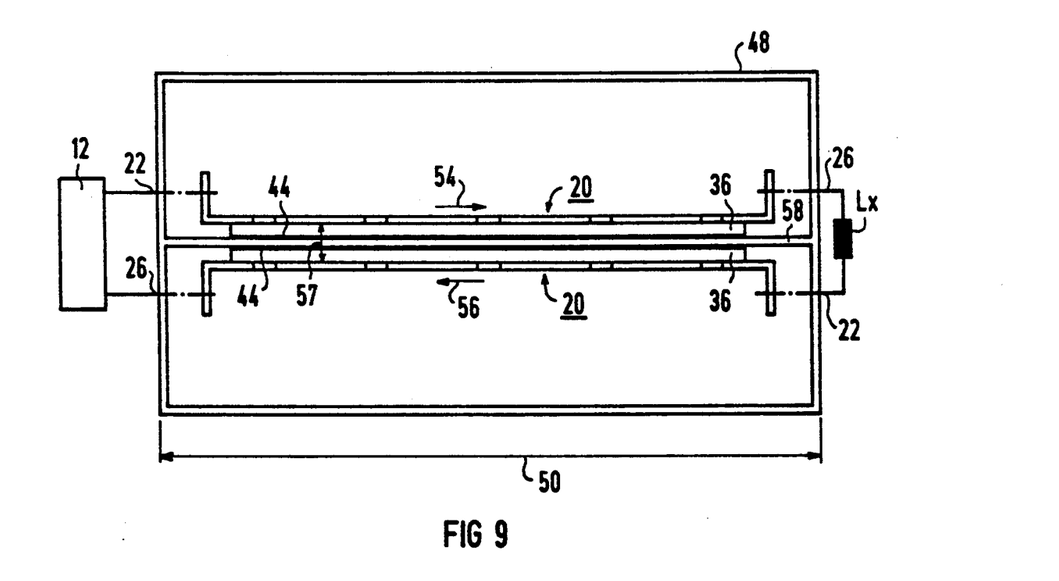
FIG. 9 is a side sectional view through a shielded housing including two anti-interference filters constructed in accordance with the principles of the present invention arranged a small distance from each other so that the respective blocking circuit coils of the two filters are substantially congruent.

The structural format of two anti-interference filters respectively connected in a forward feed line and a return line of a gradient coil, for example the coil 7 and 8, is shown in FIG. 9, wherein the gradient coil is referenced as an inductive load Lx. The left-side terminals 22 and 26 in FIG. 9 are connected to the gradient power supply 12, and the right-side terminals 26 and 22 are connected to the gradient coil Lx. The current flow through the respective anti-interference filters 20 is shown by the arrows 54 and 56. The filters 20 are constructed and arranged in the housing 48 so that the blocking circuit coils Lp of the two anti-interference filters 20 are congruent (i.e., superimposed on one another). The spacing 57 between the respective blocking circuit coils Lp of the two anti-interference filters 20 is small, and is determined only by the thickness of the printed circuit boards 36, and the thickness of a supporting panel 58. As a result of this slight spacing between the blocking circuit coils Lp (connected in parallel) of the two anti-interference filters 20, the magnetic fields caused by the current flows in the feed line and the return line substantially cancel each other in the overall anti-interference filter, and thus will not significantly degrade the uniform static field in the radio-frequency enclosure 10.

Figure 10:
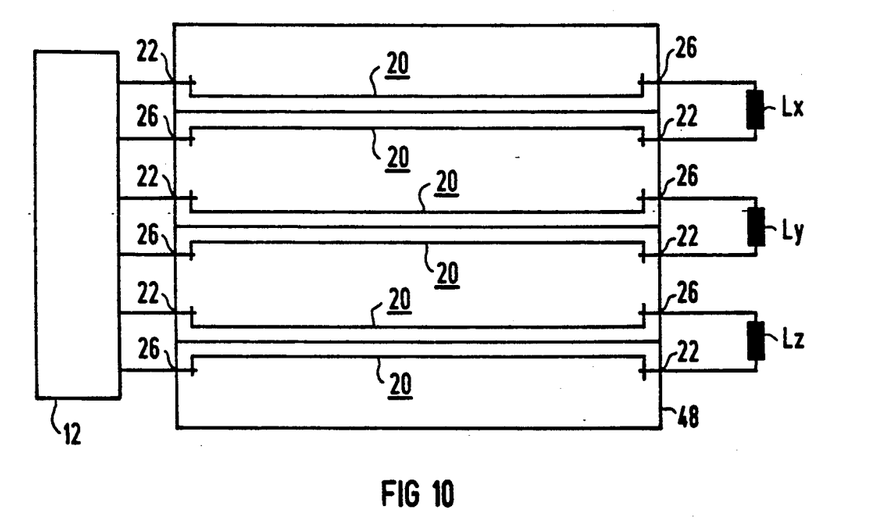
FIG. 10 is a side sectional view through a shielded housing wherein six anti-interference filters constructed in accordance with the principles of the present invention are arranged.

A schematic side view of an arrangement which includes six anti-interference filters is shown in FIG. 10, for radio-shielding the feeders for all three gradient coils Lx, Ly and Lz in a housing 48. All six anti-interference filters, which are inserted in the feeders, can be compactly accommodated in one housing 48, because the magnetic couplings between the individual anti-interference filters 20 are slight. The magnetic field produced by the gradient currents is substantially cancelled and the magnetic field of asymmetrical noise currents is also substantially cancelled due to the closely proximate relation of the anti-interference filters 20 for the forward feed and return lines. Moreover, the inductances of the blocking circuit coils Lp and the acceptor circuit coils Ls are low, and thus the magnetic field produced by symmetrical noise currents is also low.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a nuclear magnetic resonance imaging apparatus having a gradient coil with a feeder for said gradient coil, said apparatus having an operating frequency, the improvement comprising:
an anti-interference filter for radio-shielding said feeder formed by a band elimination filter which rejects signals at said operating frequency of said apparatus.

2. The improvement of claim 1 wherein said anti-interference filter is a directionally symmetrical quadrupole having first and second input terminals and first and second output terminals, said first input terminal and said first output terminal being connected to said feeder for said gradient coil, said second input terminal and said second output terminal being connected to a reference potential conductor, said quadrupole having a first plurality of blocking circuits connected in series between said first input terminal and said first output terminal, said blocking circuits having respective junctions therebetween, and having a second plurality of acceptor circuits which are respectively connected between said input terminals, between said junctions of said blocking circuits and said reference potential conductor, and between said output terminals, said second plurality being one higher than said first plurality.

3. The improvement of claim 2 wherein each of said blocking circuits consists of a blocking circuit coil and a blocking circuit capacitor connected in parallel, and wherein each of said acceptor circuits consists of an acceptor circuit coil and an acceptor circuit capacitor connected in series.

4. The improvement of claim 3 wherein each blocking circuit coil has a center tap, and wherein said quadrupole further has a capacitor connected between each center tap of each blocking circuit coil and said reference potential conductor.

5. The improvement of claim 3 wherein each of said blocking circuit coils has a center tap, and wherein said quadrupole further has a resistor connected between the center tap of one of said locking circuit coils and said reference potential conductor, and a capacitor connected between the respective center taps of the remainder of said blocking coils and said reference potential conductor.

6. The improvement of claim 3 wherein said blocking circuit coils are disposed in a plane, and are formed by serpentine conductor sections in said plane.

7. The improvement of claim 6 wherein each blocking circuit coil consists of a U-shaped conductor section having ends, and wherein the ends of the U-shaped conductor section in each blocking circuit are connected to each other by the blocking circuit capacitor for that blocking circuit.

8. The improvement of claim 6 wherein said quadrupole is constructed on a printed circuit board with said serpentine conductor sections forming said blocking circuit coils being disposed on a first side of said printed circuit board, said circuit board having a plurality of electrical interconnects forming said acceptor circuit coils for those acceptor circuits connected to said junctions of said blocking circuits, said electrical interconnects being disposed on said first side of said printed circuit board, said blocking circuit capacitors and said acceptor circuit capacitors for those acceptor circuits connected to said junctions of said blocking circuits also being disposed on said first side of said printed circuit board, and said printed circuit board having a second side which is substantially covered with a metallization electrically connected to said reference potential conductor.

9. The improvement of claim 2 wherein said quadrupole is disposed in a shielded housing closed on all sides, said first input terminal and said output terminal being conducted out of said shielded housing via respective bushings, said reference potential conductor being electrically connected to said shielded housing, and said shielded housing having length and a width in a ratio which is selected so that the waveguide attenuation of said housing is higher than the attenuation of said anti-interference filter.

10. The improvement of claim 9 wherein the respective acceptor circuits which are connected between said input terminals and between said output terminals are each formed by an acceptor circuit capacitor having leads forming the acceptor circuit coil for that acceptor circuit said leads being shaped to form a conductor loop, said conductor loops being respectively connected between said input terminal and said shielded housing and between said output terminal and said shielded housing, and said conductor loops being disposed perpendicularly relative to each other.

11. In a magnetic resonance imaging apparatus having a gradient coil with a forward feed line and a return line, said apparatus having an operating frequency, the improvement comprising:
a pair of anti-interference filters for radio-shielding said forward feed line and said return line respectively connected in said forward feed line and said return line, each anti-interference filter being a band elimination filter which rejects signals at said operating frequency of said apparatus, each of said anti-interference filters containing a plurality of blocking circuits and each blocking circuit having a blocking circuit coil, said anti-interference filters being disposed in a shielded housing spaced from each other with said blocking circuit coils of said anti-interference filters coinciding, each anti-interference filter having a direct current direction therein with the respective direct current directions in said anti-interference filters being opposite for substantially cancelling the respective magnetic fields in said shielded housing produced by the direct currents in said anti-interference filters.

12. In a magnetic resonance imaging apparatus having three gradient coils each having a forward feed line and a return line associated therewith, said apparatus having an operating frequency, the improvement comprising:

an anti-interference filter combination for radio-shielding said forward feed lines and said return lines of said gradient coils formed by six anti-interference filters respectively connected in said forward feed lines and said return lines of said three gradient coils, said six anti-interference filters being contained in a shielded housing and each anti-interference filter being a band elimination filter which rejects signals at said operating frequency of said apparatus.

* * * * *